(12) United States Patent
Urankar

(10) Patent No.: US 10,732,207 B2
(45) Date of Patent: Aug. 4, 2020

(54) ELECTRIC CURRENT MEASURING DEVICE, CURRENT-MEASURING UNIT AND METHOD FOR MANUFACTURING A CURRENT-MEASURING DEVICE

(71) Applicant: SCHNEIDER ELECTRIC INDUSTRIES SAS, Rueil Malmaison (FR)

(72) Inventor: Lionel Urankar, Fontaine (FR)

(73) Assignee: SCHNEIDER ELECTRIC INDUSTRIES SAS, Rueil Malmaison (FR)

(*) Notice: Subject to any disclaimer, the term of this patent is extended or adjusted under 35 U.S.C. 154(b) by 131 days.

(21) Appl. No.: 16/137,601

(22) Filed: Sep. 21, 2018

(65) Prior Publication Data

US 2019/0187184 A1    Jun. 20, 2019

(30) Foreign Application Priority Data

Dec. 14, 2017    (FR) ...................................... 17 62117

(51) Int. Cl.
*G01R 15/18* (2006.01)
*G01R 19/00* (2006.01)

(52) U.S. Cl.
CPC ....... *G01R 15/181* (2013.01); *G01R 19/0092* (2013.01)

(58) Field of Classification Search
CPC .......................... G01R 15/181; G01R 19/0092
USPC .................................. 324/117 R, 117 H–127
See application file for complete search history.

(56) References Cited

U.S. PATENT DOCUMENTS

| 6,313,623 | B1 | 11/2001 | Kojovic et al. |
| 6,426,617 | B1 | 7/2002 | Haensgen et al. |
| 2002/0167301 | A1 | 11/2002 | Haensgen et al. |
| 2015/0245534 | A1 | 8/2015 | Seo et al. |
| 2017/0146572 | A1 | 5/2017 | Urankar |

FOREIGN PATENT DOCUMENTS

| EP | 3 171 182 A1 | 5/2017 |
| WO | WO 01/057543 A1 | 8/2001 |

OTHER PUBLICATIONS

French Preliminary Search Report dated Jun. 21, 2018 in French Application 17 62117 filed on Dec. 14, 2017 (with English Translation of Categories of Cited Documents and Written Opinion).

*Primary Examiner* — Melissa J Koval
*Assistant Examiner* — Courtney G McDonnough
(74) *Attorney, Agent, or Firm* — Oblon, McClelland, Maier & Neustadt, L.L.P.

(57) ABSTRACT

A compact current-measuring device including a first printed circuit assembly including a first current sensor positioned around a first aperture and a second aperture, and a second printed circuit assembly including a second current sensor positioned around a third aperture. The second sensor includes a second rectilinear winding portion positioned facing a first rectilinear winding portion of the first current sensor. The second aperture is positioned facing the third aperture. A unit for measuring the electric current flowing in current lines of an electrical installation, and a method for manufacturing a current-measuring device.

13 Claims, 7 Drawing Sheets

ELECTRIC CURRENT MEASURING DEVICE, CURRENT-MEASURING UNIT AND METHOD FOR MANUFACTURING A CURRENT-MEASURING DEVICE

TECHNICAL FIELD

The present invention relates to a compact device for measuring the electric current flowing in current lines of an electrical installation. The invention also relates to a method for manufacturing such a measuring device and an electric current-measuring unit.

PRIOR ART

An electric current sensor is used to measure the intensity of an electric current flowing in an electric line. Such a measurement is necessary so as to quantify the power and/or the electrical energy consumed by such a receptor or so as to detect a functioning anomaly of the electrical receptor. Such a sensor is installed around the current line in which the current to be measured circulates. In an industrial installation, the use of electrical energy distributed in three-phase form is widespread. In this case, an electric current sensor must be installed around each one of the three phases. Given that electrical equipment is increasingly compact and that the density of equipment in an electrical installation is increasingly high, it is necessary to have extremely compact current sensors for installation in or near a measuring unit or protection unit. Furthermore, so as to ensure conformity with the installation standards and interchangeability of the units, the distance between the current lines or conductors is generally imposed, for example 18, 25 or 27 mm. Consequently, any installation of current sensors around current lines must respect the same constraints. On the other hand, in a three-phase installation, the close proximity between the different current lines and the current sensors can be source of perturbation of the current measurements. In fact, a current sensor installed around one current line can be influenced by a magnetic field created by a current flowing in another current line situated nearby. It is therefore necessary to have current sensors that are compact, accurate and not highly influenced by outside perturbations.

The document EP 3 171 182 A1 discloses a Rogowski type of current sensor including two layers of coils. Such a sensor is not highly sensitive to electromagnetic perturbations and has a shape suitable for installation in compact industrial equipment.

The document WO 01/57 543 A1 describes a Rogowski current sensor consisting of two windings, each winding being positioned on a printed circuit board. Several current sensors can be implemented side by side on each printed circuit board.

DESCRIPTION OF THE INVENTION

The invention aims to increase the compactness of a set of sensors intended to measure the amplitude of the electric current flowing in several electric lines without degrading measuring accuracy and without increasing sensitivity to outside perturbations.

For this purpose, the invention describes a device for measuring the current flowing in at least two current lines of an electrical installation, comprising:
a first printed circuit assembly including:
  a first aperture for passing a first current line,
  a second aperture for passing a second current line, and
  a first current sensor positioned around the first aperture so as to measure the current flowing in the first current line, said first current sensor including at least one first rectilinear winding portion positioned between the first aperture and the second aperture,
a second printed circuit assembly, positioned parallel to the first printed circuit assembly, said second assembly including:
  a third aperture, facing the second aperture, for passing the second current line,
  a second current sensor positioned around the third aperture so as to measure the current flowing in the second current line passing through the third aperture, said second sensor including at least one second rectilinear winding positioned facing the first rectilinear winding portion of the first current sensor.

The current-measuring device is preferably such that:
the first printed circuit assembly includes a fourth aperture intended for passing a third current line,
a third current sensor, formed in the first printed circuit assembly, is positioned around the fourth aperture so as to measure the current flowing in the third current line, and
the third current sensor includes at least one third rectilinear winding portion positioned between the second aperture and the fourth aperture.

Advantageously, the first, second and third sensors are Rogowski type current sensors.

The second current sensor preferably includes a fourth rectilinear winding portion positioned facing the third rectilinear winding portion of the third current sensor.

Advantageously, the first printed circuit assembly includes first soldering pads, the second printed circuit assembly includes second soldering pads positioned facing the first soldering pads so as to solder the second printed circuit assembly on the first printed circuit assembly such that the second rectilinear winding portion is positioned facing the first rectilinear winding portion and the fourth rectilinear winding portion is positioned facing the third rectilinear winding portion.

Preferably, the sum of the surface areas of the soldering pads of the second printed circuit assembly is greater than 3% of the surface area of a side of the second printed circuit assembly.

Preferably, the first printed circuit assembly is formed by a first printed circuit bonded to a second printed circuit by means of a first ply pre-impregnated with resin and the second printed circuit assembly is formed by a third printed circuit bonded to a fourth printed circuit by means of a second ply pre-impregnated with resin.

Advantageously, the first current sensor comprises a first winding formed in the first printed circuit and comprises a second winding formed in the second printed circuit, the first winding and the second winding have the same spatial requirement and are connected in series, and the second current sensor comprises a third winding formed in the third printed circuit and comprises a fourth winding formed in the fourth printed circuit, the third winding and the fourth winding have the same spatial requirement and are connected in series.

The first, second, third and fourth printed circuits are preferably manufactured from the same printed circuit board.

The printed circuit board preferably has a thickness greater than 1.5 millimetres.

Advantageously, the first printed circuit board assembly and the second printed circuit board assembly include sides coated with a solder mask.

The invention also relates to a unit for measuring the current flowing in at least two current lines of an electrical installation, said measuring unit including:
- a measuring circuit for measuring the amplitude of electrical signals,
- a communication circuit connected to the measuring circuit so as to transmit measurement results of the measured signals, and
- a power supply circuit for powering the measuring circuit and the communication circuit, and
- a current-measuring device such as that described previously, connected to the measuring circuit so as to deliver to the measuring circuit signals representative of the currents flowing in the, at least two, current lines, a first current line passing in a first aperture of the current-measuring device and a second line passing in a second aperture and a third aperture of the current-measuring device.

The invention also relates to a method for manufacturing a current-measuring device such as that described previously, said method including the following steps:
- cutting a printed circuit motherboard into a first board intended to make the first and third printed circuits and a second printed circuit board intended to make the second and fourth printed circuits,
- the first etching, on a first side of the first board, of first tracks corresponding to the first and third windings of a first and of at least one second current sensor, and etching on the second printed circuit board, of first tracks corresponding to the second and fourth windings of a first and of at least one second current sensor,
- drilling and metallization of first vias for connecting the first tracks,
- bonding the first printed circuit board to the second printed circuit board by means of a first ply preimpregnated with resin, the first side of the first board facing the first side of the second printed circuit board,
- the second etching on a second side of the first board, of second tracks corresponding to the first and third windings and etching on a second side of the second printed circuit board, of second tracks corresponding to the second and fourth windings
- drilling and metallization of second vias for connecting the tracks between the first side and the second side of the first and of the second printed circuit boards,
- applying a solder mask on the second side of the first printed circuit board and on the second side of the second printed circuit board,
- cutting at least one first and one second aperture,
- cutting a first printed circuit assembly and a second printed circuit assembly,
- positioning the second printed circuit assembly on the first printed circuit assembly such that at least one second rectilinear winding portion of the second current sensor is positioned facing a first rectilinear winding portion of the first current sensor, and
- soldering the second printed circuit assembly to the first printed circuit assembly.

BRIEF DESCRIPTION OF THE DRAWINGS

Other advantages and characteristics will emerge more clearly from the description that will follow of particular embodiments of the invention, given as non-limitative examples and shown on the attached drawings, on which.

DETAILED DESCRIPTION OF PREFERRED EMBODIMENTS

Figure 1:
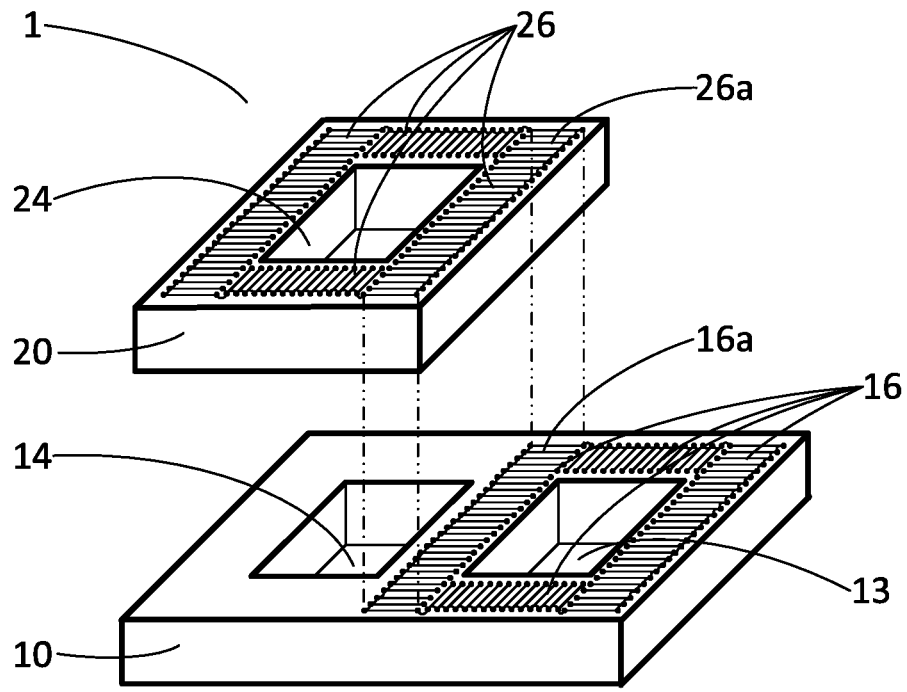
FIG. 1 is a perspective view of a current-measuring device so as to illustrate a facing position of a first rectilinear winding portion of a first current sensor with a second rectilinear winding portion of a second current sensor, according to a first embodiment.

FIG. 1 is a perspective view of a current-measuring device 1 according to a first embodiment. The measuring device 1 comprises a first printed circuit assembly 10 including a first aperture 13 for allowing passage of a first current line 2, not shown on FIG. 1. The first printed circuit assembly 10 includes a second aperture 14 for passing a second current line 3, not shown on FIG. 1. A first current sensor 16 is positioned around the first aperture 13 so as to measure the current flowing in the first current line 2 passing through the first aperture 13. The first current sensor 16 includes a winding positioned around the first aperture 13. A first rectilinear winding portion 16a is preferably positioned between the first aperture 13 and the second aperture 14.

The current-measuring device 1 comprises a second printed circuit assembly 20, positioned parallel to the first printed circuit assembly 10. The second printed circuit assembly 20 is mounted on the first printed circuit assembly 10, that is to say that the copper-plated sides of the first and second printed circuit assemblies are parallel to each other. The second printed circuit assembly 20 includes a third aperture 24. According to the invention, the first printed circuit assembly 10 and the second printed circuit assembly 20 are positioned such that the third aperture 24 is positioned facing the second aperture 14 so as to allow passage of the second current line 3 through the second aperture 14 and the third aperture 24. The first printed circuit assembly 10 and the second printed circuit assembly 20 are preferably coupled together, the expression "positioned facing" corresponds to a position of the second aperture 14 facing the third aperture 24 so as to form a continuous passage for the second current line 3. A second current sensor 26 is positioned around the third aperture 24 so as to measure the current flowing in the second current line 3 passing through the third aperture 24. The second current sensor 26 includes a winding positioned around the third aperture 24. A second rectilinear winding portion 26a of the second current sensor 26 is preferably positioned facing the first rectilinear winding portion 16a of the first current sensor 16. The expression "positioned facing" means that the direction of the second rectilinear winding portion 26a is parallel to the direction of the first rectilinear winding portion 16a. Since the first printed circuit assembly 10 and the second printed circuit assembly 20 are preferably coupled, the first rectilinear winding portion 16a of the first current sensor 16 and the second rectilinear winding portion 26a of the second current sensor 26 are coupled and positioned in the same direction, the rectilinear winding portions 16a and 26a being oriented along parallel axes. Such a positioning is illustrated in FIG. 1 by dotted lines between the ends of the first rectilinear winding portion 16a of the first current sensor 16 and the second rectilinear winding portion 26a of the second current sensor 26.

Figure 2:
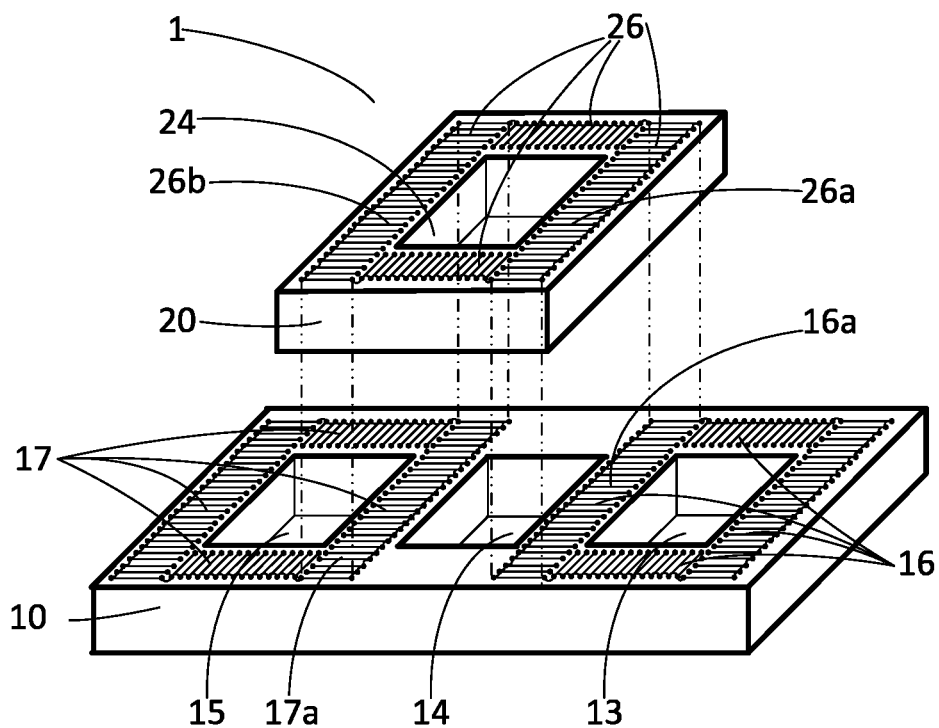
FIG. 2 is a perspective view of a current-measuring device so as to illustrate a facing position of several rectilinear winding portions of several current sensors according to a preferred embodiment intended for measuring current in a three-phase network.

The current measuring device according to the invention is preferably intended for measuring the current flowing in each of the current lines of a three-phase network. FIG. 2 is a perspective view of a current-measuring device that is particularly suitable for a three-phase electrical installation. For this purpose, the first printed circuit assembly 10 includes a fourth aperture 15 intended for passing a third current line 4. A third current sensor 17 is formed in the first printed circuit assembly 10. Said third current sensor 17 is positioned around the fourth aperture 15 so as to measure the current flowing in the third current line 4, said third current line 4 passing through the fourth aperture 15. The third current sensor 17 includes a winding positioned around the fourth aperture 15, said winding including a third rectilinear winding portion 17a between the fourth aperture 15 and the second aperture 14. The second current sensor 26 includes a fourth rectilinear winding portion 26b positioned to be facing the third rectilinear winding portion 17a of the third current sensor 17. The first rectilinear winding portion 16a of the first current sensor 16 is thus situated facing the second rectilinear winding portion 26a of the second current sensor 26 and the third rectilinear winding portion 17a of the third current sensor 17 is situated facing the fourth rectilinear winding portion 26b of the second sensor 26. This advantageous positioning in quincunx of the three current sensors 16, 26 and 17 allows a compact industrial implementation: the distance between the apertures 13 and 14 and the distance between the apertures 14 and 15 is limited to the width of a single current sensor winding, the apertures 13, 14 and 15 can be dimensioned so as to leave a maximum passage for the current lines 2, 3 and 4. On the other hand, the first and the second printed circuit assemblies 10, 20 are coupled and thus form a current-measuring device of little thickness and therefore compact.

Advantageously, the first, second and third sensors 16, 26 and 17 are Rogowski type current sensors. Such a sensor comprises a support in antimagnetic material and a winding surrounding an electrical conductor travelled by a current to be measured. The first and second printed circuit assemblies 10, 20 constitute the antimagnetic support for the current sensors 16, 26, 17. The windings of the current sensors 16, 26 and 17 are implemented by means of surface conducting tracks of the printed circuit, the tracks of one side of a printed circuit assembly being connected with the tracks of the opposite side of the same printed circuit assembly by metallized holes also called "passages" or "vias". This technology is conventional.

The industrial implementation of a current-measuring device 1 of the invention poses several problems:
  precisely positioning, and in a manner reproducible in mass production, the first rectilinear winding portion 16a facing the second rectilinear winding portion 26a and simultaneously positioning the third rectilinear winding portion 17a facing the fourth rectilinear winding portion 26b, and
  ensuring electrical insulation on one hand between the first rectilinear winding portion 16a of the first current sensor 16 and the second rectilinear winding portion 26a and on the other between the third rectilinear winding portion 17a and the fourth rectilinear winding portion 26b.

Figure 3:
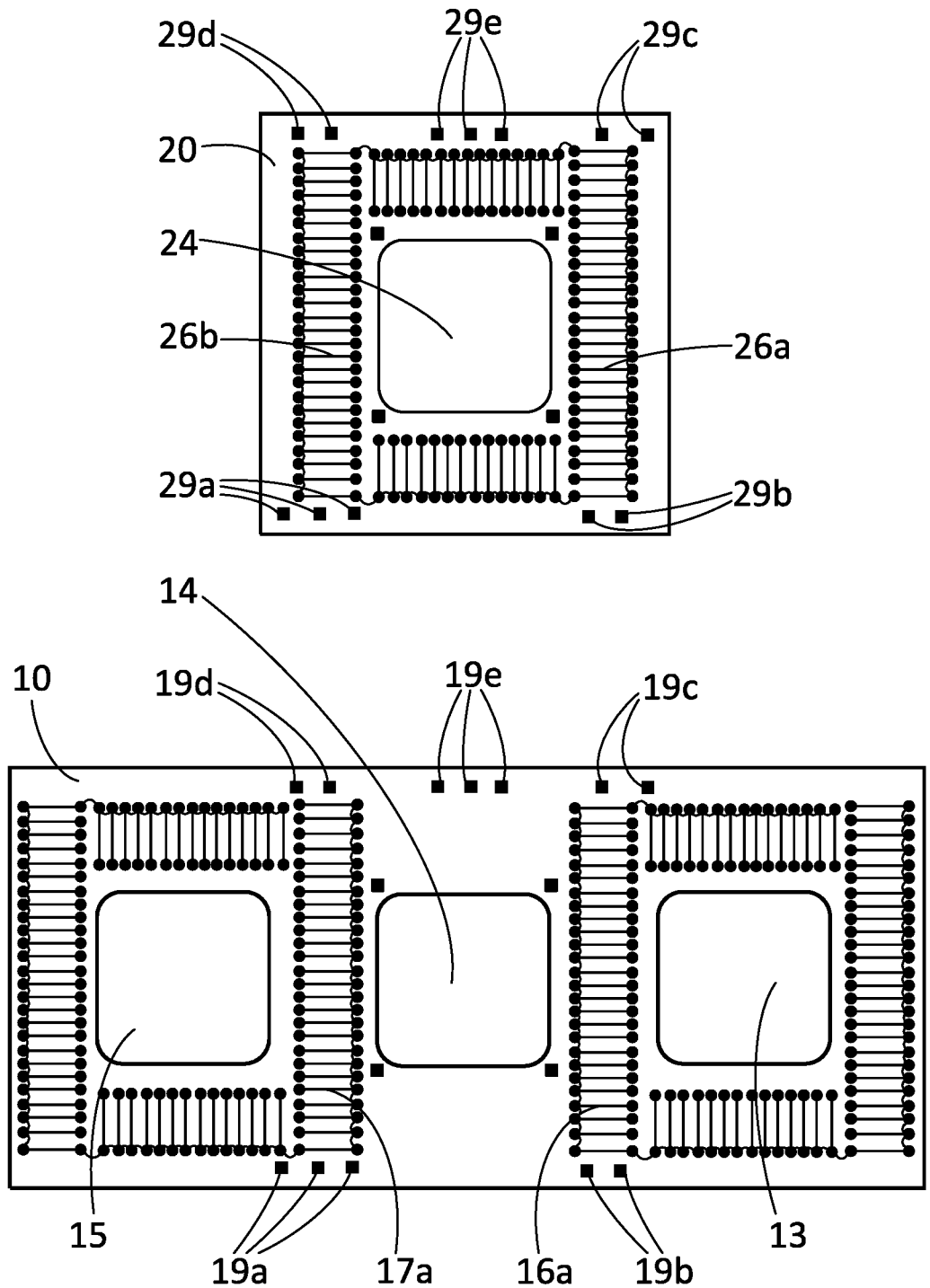
FIG. 3 shows an example of positioning soldering pads between a first printed circuit assembly and a second printed circuit assembly so as to implement a facing position of several rectilinear winding portions of current sensors.

In order to resolve the positioning precision problem, the first printed circuit assembly 10 includes first soldering pads 19a, 19b, 19c, 19d, the second printed circuit assembly 20 includes second soldering pads 29a, 29b, 29c, 29d as shown on FIG. 3. Each of the first soldering pads 19a, 19b, 19c, 19d is positioned respectively facing the second soldering pads 29a, 29b, 29c, 29d. For example, the first soldering pads 19a face the second soldering pads 29a, the first soldering pads 19b face the second soldering pads 29b and so on. The soldering pads are traced by a screen printing method, which guarantees very precise and reproducible positioning of said pads. A deposit of soldering paste is placed on the soldering pads before soldering the second printed circuit assembly 20 on the first printed circuit assembly 10, then the second printed circuit assembly 20 is positioned on the first printed circuit assembly 10. A passage in a re-melting furnace makes the soldering paste melt. The paste creates a liquid link between the soldering pads positioned facing each other and improves the positioning of the second printed circuit assembly 20 on the first printed circuit assembly 10 through the action of surface tension. This way, the second rectilinear winding portion 26a is positioned precisely facing the first rectilinear winding portion 16a. In the same way, the fourth rectilinear winding portion 26b is positioned facing the third rectilinear winding portion 17a. This technical solution does not require any mechanical guide and does not require any additional part.

When the soldering paste liquefies at the moment of soldering, the weight of the second printed circuit assembly 20 tends to squeeze the liquid solder and there is a risk of the second rectilinear winding portion 26a coming into contact with the first rectilinear winding portion 16a, which is detrimental to the functioning of the current-measuring device. There is an identical risk of contact between the fourth rectilinear winding portion 26b and the third rectilinear winding portion 17a. So as to ensure electrical insulation between the winding portions situated facing each other, the sum of the surface areas of the soldering pads 29a, 29b, 29c, 29d of the second printed circuit assembly 20 is greater than 3% of the surface area of a side of the second printed circuit assembly 20. This way, the quantity of soldering paste spread over the soldering pads is sufficient to hold the second printed circuit assembly 20 at a distance of the order of 100 to 125 microns from the first printed circuit assembly 10. The cooling of the soldering paste fixes in a durable manner the position of the second printed circuit assembly 20 relative to the first printed circuit assembly 10. There is thus no risk of contact between the different winding portions. Furthermore, the soldering pads 29a, 29b, 29c, 29d are distributed as uniformly as possible over the surface of the second printed circuit assembly 20 so as to distribute uniformly the weight of the second printed circuit assembly 20 over all of the soldering pads 29a, 29b, 29c, 29d. Additional connection pads 19e and 29e are positioned respectively on the first printed circuit assembly 10 and on the second printed circuit assembly 20 so as to ensure the electrical connection of the second current sensor 26 to a measuring circuit 51.

Figure 4A:
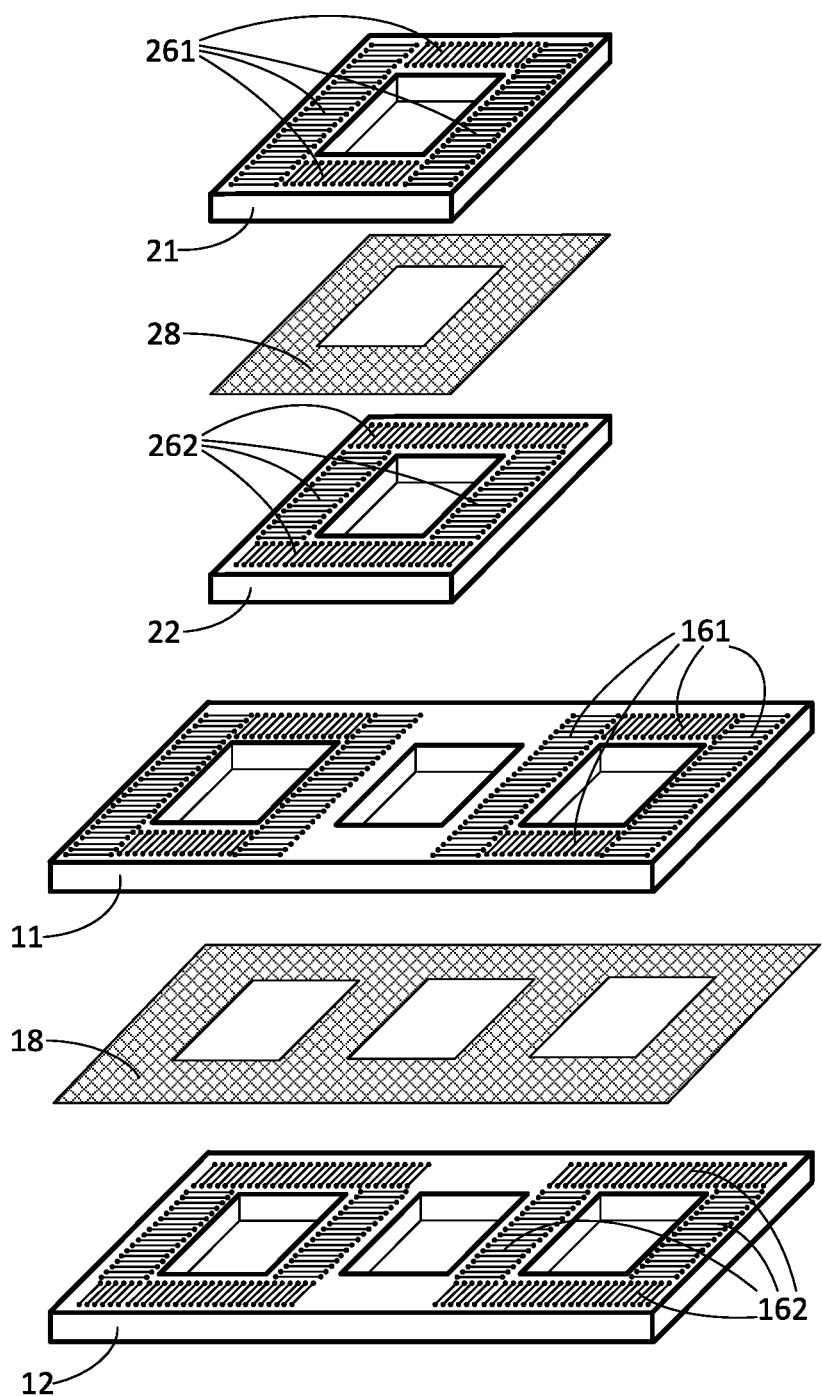
FIG. 4A shows an exploded view of the current-measuring device shown in FIG. 2.
Figure 5:
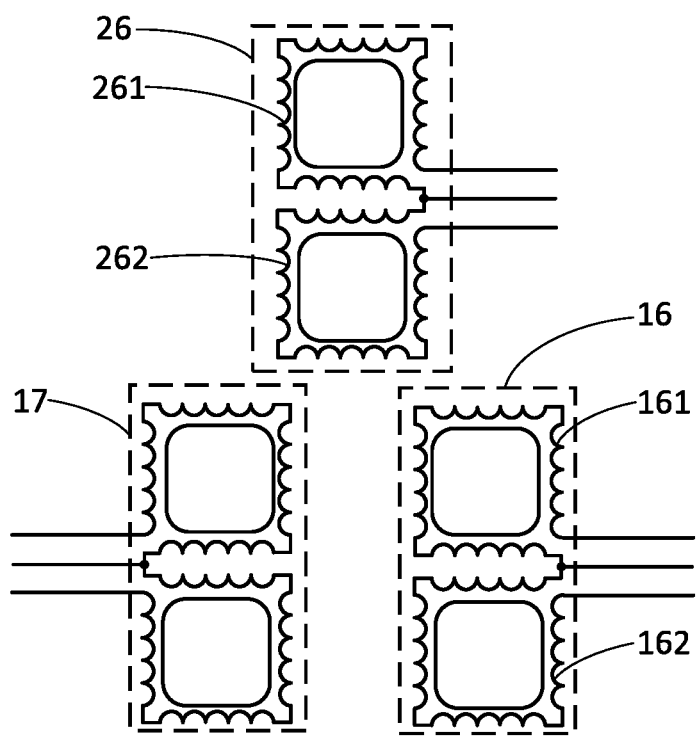
FIG. 5 shows connection diagrams for the windings forming the current sensors for a current-measuring device such as that shown in FIG. 4B.

In a three-phase installation, the close proximity between the different current lines 2, 3, 4 and the current sensors 16, 17, 26 can be source of perturbation of the current measurements. So as to limit any parasitic influence, as shown in FIG. 4A, the first printed circuit assembly 10 is formed by a first printed circuit 11 bonded to a second printed circuit 12 by means of a first ply 18 pre-impregnated with resin. Advantageously, during the bonding operation, the resin fills the vias of the first and second printed circuits 11, 12 and ensures capping of said vias after the resin has cured. This operation assists uniform depositing of solder mask on the sides of the first printed circuit assembly during a subsequent manufacturing step. The first printed circuit 11 is the support for a first winding 161, the second printed circuit is the support for a second winding 162. The first winding 161 and the second winding 162 are part of the first current sensor 16. The first winding 161 and the second winding 162 constitute a first and a second layer of coils of the same spatial requirement. The orientation of the turns of the first winding 161 and of the second winding 162 is preferably such as that described in the document EP 3 171 182 A1. The first winding 161 and the second winding 162 are positioned facing each other as shown in FIG. 4A. In the same way, the second printed circuit assembly 20 is formed by a third printed circuit 21 bonded to a fourth printed circuit 22 by means of a second ply 28 pre-impregnated with resin, the resin likewise ensuring capping of the vias of the third and fourth printed circuits 21, 22. The second printed circuit 12 is the support for a third winding 261, the fourth printed circuit 22 is the support for a fourth winding 262. The third winding 261 and the fourth winding 262 are part of the second current sensor 26 and are positioned in a similar manner to the first winding 161 and the second winding 162. In particular, the third winding 261 and the fourth winding 262 have the same spatial requirement. The third current sensor 17 is constructed and positioned in a similar way to the first current sensor 16. The connection diagrams for the windings forming the current sensors 16, 17 and 26 are shown in FIG. 5. The first winding 161 and the second winding 162 of the first current sensor 16 are connected in series. In the same way, the third winding 261 and the fourth winding 262 are connected in series.

The first, second, third and fourth printed circuits 11, 12, 21 and 22 are advantageously double-sided printed circuits whose cost is low. The two-by-two association of the printed circuits is financially much more valid than using a single multilayer technology printed circuit. Furthermore, the use of a first and a second pre-impregnated ply 18, 28 provides, without extra cost and without any additional industrial operation, electrical insulation respectively between the first and the second windings 161, 162 and between the third and the fourth windings 261, 262.

The current-measuring device 1 must be such that, with the same current flowing in the current lines, the signal delivered by all of the current sensors must be the same. Since the sensors are of the Rogowski type, the delivered signal depends on the surface area of the turnings of the windings of said sensors. So as to ensure constant and uniform surface areas of the turns of all of the current sensors of the measuring device 1, the first, second, third and fourth printed circuits 11, 12, 21, 22, are manufactured from a single printed circuit board. This way, the thickness of the first, second, third and fourth printed circuits 11, 12, 21, 22 is identical. On the other hand, the windings are formed by a technique of etching the layers of copper that are surface deposited on the printed circuits. This etching technique has the advantage of a very high degree of precision and finesse due to its use on an industrial scale in manufacturing electronic equipment. This way, surface area variation of the turns of the windings of the current sensors 161, 162, 261, 262 of the same current-measuring device 1 is extremely slight, the variation in signal delivered by two current sensors of the same measuring device 1 will also be extremely slight. This method of manufacturing the current-measuring device 1 is therefore suitable for implementation in industrial mass production. The printed circuit board preferably has a thickness greater than 1.5 millimetres so as to maximize the surface area of the turns of the sensor windings. Thicknesses 1.56 mm or 2 mm are standardized thickness values.

A solder mask, deposited on the sides of the first and second printed circuit assemblies, insulates in particular the turnings of the windings 161 and 262 and prevents any contact between said windings 161 and 262.

Figure 4B:
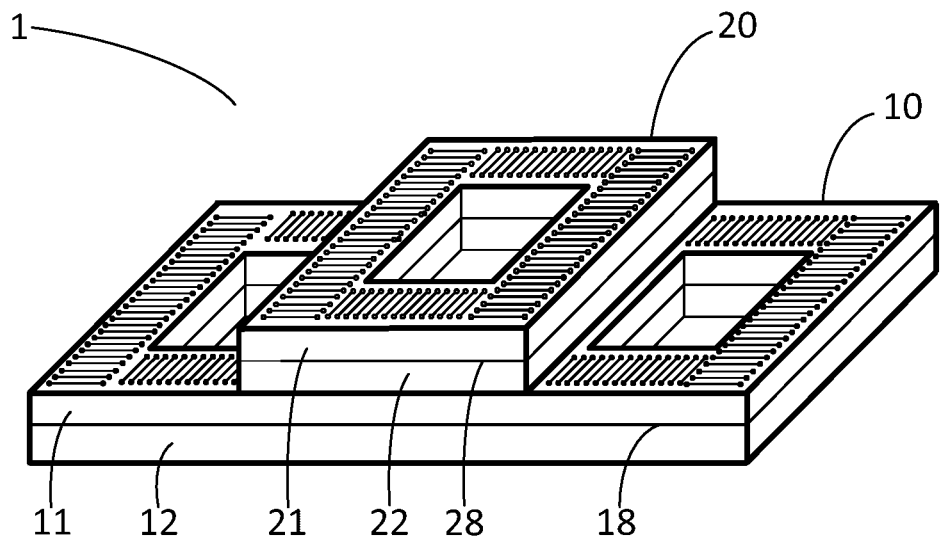
FIG. 4B is a perspective view of the current-measuring device according to a preferred embodiment intended for measuring current for a three-phase network.

FIG. 4B is a perspective view of the current-measuring device 1 after soldering the second printed circuit assembly 20 on the first printed circuit assembly 10. The current-measuring device 1 shown corresponds to a preferred embodiment intended for measuring current for a three-phase network. Such a device is particularly suitable for installation in a current-measuring unit.

Figure 6:
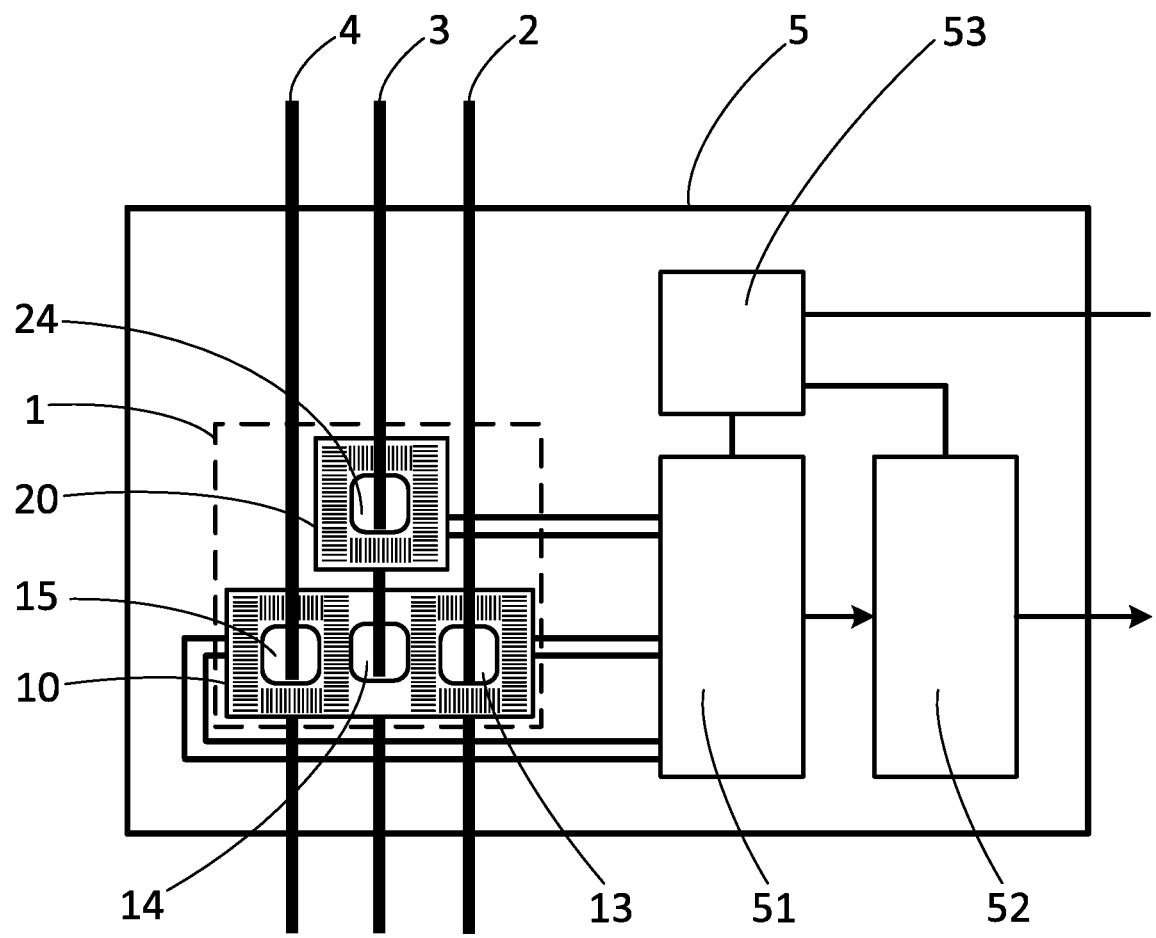
FIG. 6 shows a block diagram of a measuring unit integrating a current-measuring device according to the invention.

The invention also relates to a measuring unit 5 intended for measuring the current flowing in at least two current lines 2, 3 of an electrical installation. Such a measuring unit 5, as illustrated in FIG. 6, includes:
  a measuring circuit 51 for measuring the amplitude of electrical signals,
  a communication circuit 52 connected to the measuring circuit 51 so as to transmit measurement results of the measured signals,
  a power supply circuit 53 for powering the measuring circuit 51 and the communication circuit 52, and
  a current-measuring device 1 such as that described previously.

The current measuring device 1 is connected to the measuring circuit 51 so as to deliver to said measuring circuit signals representative of the currents flowing in the, at least two, current lines 2, 3. For this purpose, the first current line 2 passes in the first aperture 13 of the first printed circuit assembly 10. The second current line 3 passes in the second aperture 14 of the first printed circuit assembly 10 and passes in the third aperture 24 of the second printed circuit device 20. If a third current line 4 exists, it passes in the fourth aperture 15 of the first printed circuit assembly 10.

Figure 7:
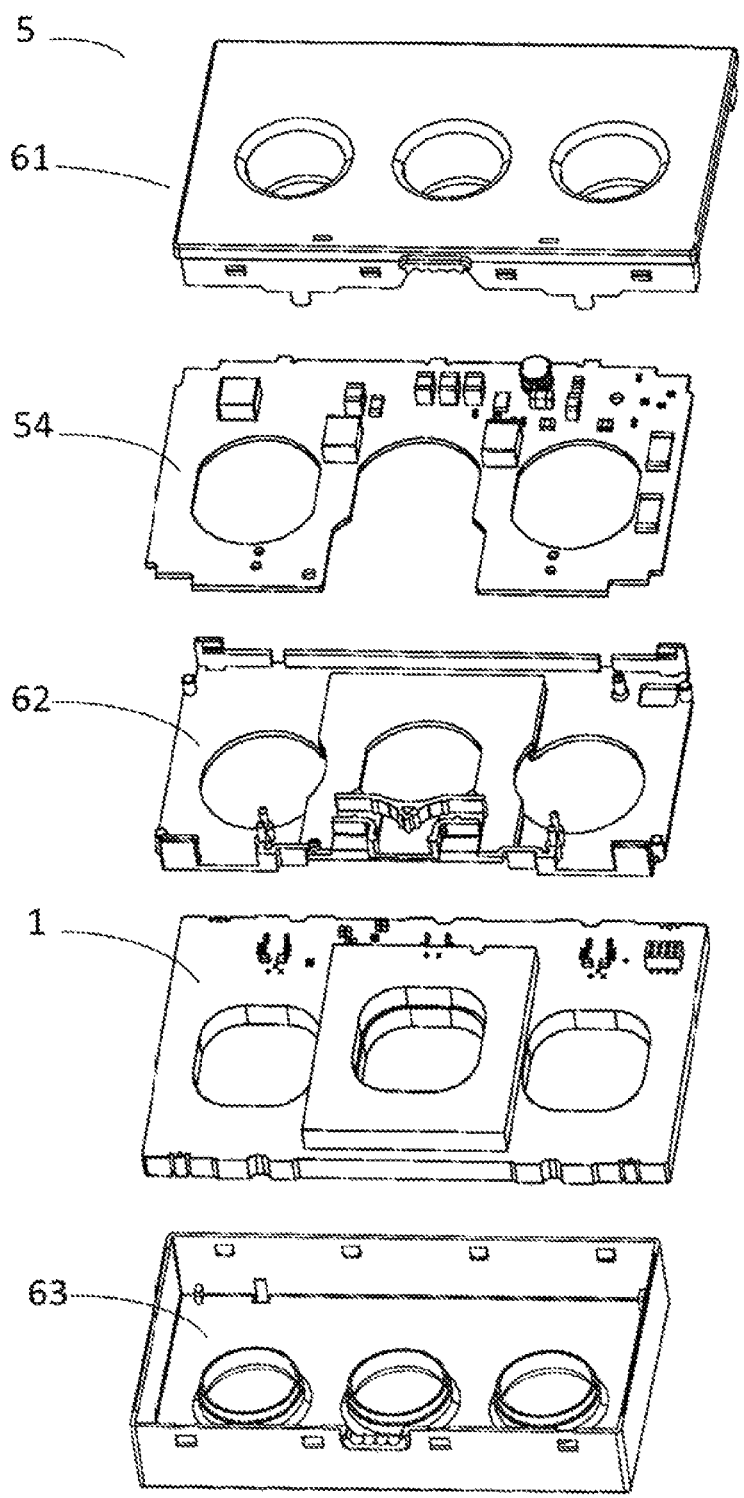
FIG. 7 shows an exploded view of a measuring device integrating a current-measuring device according to the invention.
Figure 8:
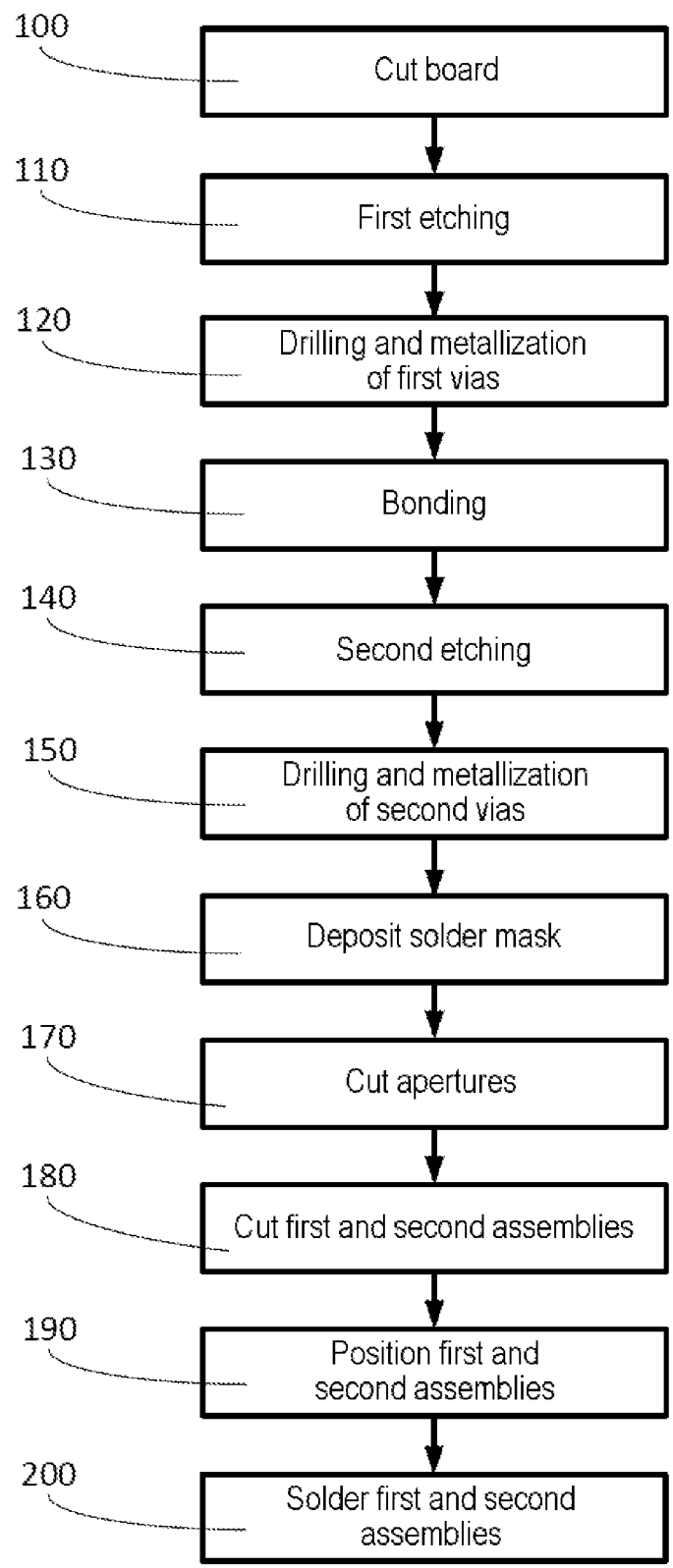
FIG. 8 shows a flow chart of a method for manufacturing a current-measuring device of the invention.

An industrial embodiment of a measuring unit 5 is shown as an exploded view in FIG. 7. The current-measuring device 1 is mechanically held in a first half housing 63. Advantageously, some components of the measuring circuit 51 are located on the first, second, third and fourth printed circuits 11, 12, 21, 22 as close as possible to the current sensors 16, 26, 17 so as to reduce the distance between the sensors and the measuring circuit. The immunity of the current sensors to outside perturbations is thus reinforced. The communication 52 and power supply 53 circuits are grouped on an electronic card 54. A module in insulating material separates the current-measuring device 1 from the electronic card 54. The electrical connections, preferably wired, between the current-measuring device 1 and the electronic card 54 are not shown on FIG. 7. A second half housing 61 ensures mechanical holding of the electronic card 54. The first and second half housings 61 and 63 ensure centring of the current-measuring device 1 around the current lines 2, 3 and 4, as well as protection and electrical insulation of the current-measuring device 1 and of the electronic card 54 relative to the user and surrounding equipment.

The invention also relates to a method for manufacturing a current-measuring device 1 such as that described previously. The manufacturing process includes the following steps:
- cutting 100 a printed circuit motherboard into a first board intended to make the first and third printed circuits 11, 21 and a second printed circuit board intended to make the second and fourth printed circuits 12, 22,
- the first etching 110, on a first side of the first board, of first tracks corresponding to the first and third windings 161, 261 of the first and of at least one second current sensor 16, 26, and etching on the second printed circuit board, of first tracks corresponding to the second and fourth windings 162, 262 of the first and of the, at least one second current sensor 16, 26,
- drilling and metallization 120 of first vias for connecting the first tracks to second tracks subsequently etched on second sides of the printed circuit boards,
- bonding 130 the first printed circuit board to the second printed circuit board by means of a first ply 18 pre-impregnated with resin, the first side of the first board facing the first side of the second printed circuit board,
- the second etching 140 on a second side of the first board, of second tracks corresponding to the first and third windings 161, 261 and etching on a second side of the second printed circuit board, of second tracks corresponding to the second and fourth windings 162, 262,
- drilling and metallization 150 of second vias for connecting the tracks between the first side and the second side of the first and of the second printed circuit boards,
- applying a solder mask 160 on the second side of the first printed circuit board and on the second side of the second printed circuit board,
- cutting 170 at least one first and one second aperture 13, 14,
- cutting 180 a first printed circuit assembly 10 and a second printed circuit assembly 20,
- positioning 190 the second printed circuit assembly 20 on the first printed circuit assembly 10 such that at least one second rectilinear winding portion 26a of the second current sensor 26 is positioned facing a first rectilinear winding portion 16a of the first current sensor 16, and
- soldering 200 the second printed circuit assembly 20 to the first printed circuit assembly 10.

As a variant, it is possible to start the manufacturing process with the first etching step 110 then the drilling and metallization step 120 before passing to the cutting step 100 of the printed circuit motherboard.

Such a device for measuring the electric current flowing in the lines of an electrical installation, in particular a three-phase installation, is particularly compact and provides precise measurements, not highly influenced by outside perturbations. Economical industrial manufacturing can be achieved in mass production on a production line of electronic cards using printed circuit technology.

The invention claimed is:

1. A device for measuring the current flowing in at least two current lines of an electrical installation, wherein:
    a first printed circuit assembly comprises:
        a first aperture for passing a first current line,
        a second aperture for passing a second current line, and
        a first current sensor positioned around the first aperture so as to measure the current flowing in the first current line, said first current sensor comprising at least one first rectilinear winding portion positioned between the first aperture and the second aperture,
    a second printed circuit assembly, positioned parallel to the first printed circuit assembly, said second assembly comprising:
        a third aperture, facing the second aperture, for passing the second current line,
        a second current sensor positioned around the third aperture so as to measure the current flowing in the second current line passing through the third aperture, said second sensor comprising at least one second rectilinear winding positioned facing the first rectilinear winding portion of the first current sensor.

2. The device for measuring current according to claim 1, wherein:
    the first printed circuit assembly comprises a fourth aperture intended for passing a third current line,
    a third current sensor, formed in the first printed circuit assembly, is positioned around the fourth aperture so as to measure the current flowing in the third current line, and wherein
    the third current sensor comprises at least one third rectilinear winding portion positioned between the second aperture and the fourth aperture.

3. The device for measuring current according to claim 1, wherein the first, second and third sensors are Rogowski type current sensors.

4. The device for measuring current according to claim 1, wherein the second current sensor comprises a fourth rectilinear winding portion positioned facing the third rectilinear winding portion of the third current sensor.

5. The device for measuring current according to claim 3, wherein the first printed circuit assembly comprises first soldering pads, and wherein the second printed circuit assembly comprises second soldering pads positioned facing the first soldering pads so as to solder the second printed circuit assembly on the first printed circuit assembly such that the second rectilinear winding portion is positioned facing the first rectilinear winding portion and the fourth rectilinear winding portion is positioned facing the third rectilinear winding portion.

6. The device for measuring current according to claim 5, wherein the sum of the surface areas of the soldering pads of the second printed circuit assembly is greater than 3% of the surface area of a side of the second printed circuit assembly.

7. The device for measuring current according to claim 1, wherein the first printed circuit assembly is formed by a first printed circuit bonded to a second printed circuit with a first ply pre-impregnated with resin and that the second printed circuit assembly is formed by a third printed circuit bonded to a fourth printed circuit with a second ply pre-impregnated with resin.

8. The device for measuring current according to claim 7, wherein:
    the first current sensor comprises a first winding formed in the first printed circuit and comprises a second winding formed in the second printed circuit, the first winding and the second winding having the same spatial requirement and being connected in series, and wherein the second current sensor comprises a third winding formed in the third printed circuit and comprises a fourth winding formed in the fourth printed circuit, the third winding and the fourth winding having the same spatial requirement and being connected in series.

9. The device for measuring current according to claim 8, wherein the first, second, third and fourth printed circuits are manufactured from the same printed circuit board.

10. The device for measuring current according to claim 9, wherein the printed circuit board has a thickness greater than 1.5 millimetres.

11. The device for measuring current according to claim 1, wherein the first printed circuit board assembly and the second printed circuit board assembly comprise sides coated with a solder mask.

12. The unit for measuring the current flowing in at least two current lines of an electrical installation, said measuring unit comprising:

a measuring circuit for measuring the amplitude of electrical signals, a communication circuit connected to the measuring circuit so as to transmit measurement results of the measured signals, and a power supply circuit for powering the measuring circuit and the communication circuit, comprising a current-measuring device according to claim 1, connected to the measuring circuit so as to deliver to said measuring circuit signals representative of the currents flowing in the, at least two, current lines, a first current line passing in a first aperture of the current-measuring device and a second current line passing in a second aperture and a third aperture of the current-measuring device.

13. The method for manufacturing a current-measuring device according to claim 1, wherein said method comprises:

cutting a printed circuit motherboard into a first board intended to make the first and third printed circuits and a second printed circuit board intended to make the second and fourth printed circuits, the first etching, on a first side of the first board, of first tracks corresponding to the first and third windings of the first and at least one second current sensor, and etching on the second printed circuit board, of first tracks corresponding to the second and fourth windings of a first and of at least one second current sensor, drilling and metallization of first vias for connecting the first tracks, bonding the first printed circuit board to the second printed circuit board with a first ply pre-impregnated with resin, the first side of the first board facing the first side of the second printed circuit board, the second etching on a second side of the first board, of second tracks corresponding to the first and third windings and etching on a second side of the second printed circuit board, of second tracks corresponding to the second and fourth windings, drilling and metallization of second vias for connecting the tracks between the first side and the second side of the first and of the second printed circuit boards, applying a solder mask on the second side of the first board and on the second side of the second printed circuit board, cutting at least one first and one second aperture, cutting a first printed circuit assembly and a second printed circuit assembly, positioning the second printed circuit assembly on the first printed circuit assembly such that at least one second rectilinear winding portion of the second current sensor is positioned facing a first rectilinear winding portion of the first current sensor, and soldering the second printed circuit assembly to the first printed circuit assembly.

* * * * *